United States Patent
Cao et al.

(10) Patent No.: US 9,626,736 B2
(45) Date of Patent: Apr. 18, 2017

(54) MEMORY-AWARE MATRIX FACTORIZATION

(71) Applicant: INTERNATIONAL BUSINESS MACHINES CORPORATION, Armonk, NY (US)

(72) Inventors: Liangliang Cao, Amherst, MA (US); Liana L. Fong, Irvington, NY (US); Wei Tan, Elmsford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 7 days.

(21) Appl. No.: 14/742,746

(22) Filed: Jun. 18, 2015

(65) Prior Publication Data

US 2016/0371809 A1 Dec. 22, 2016

(51) Int. Cl.
G06F 13/16 (2006.01)
G06F 3/06 (2006.01)
G06F 9/45 (2006.01)
H03M 13/00 (2006.01)
G06T 1/60 (2006.01)
G06F 12/0875 (2016.01)
G06F 12/0813 (2016.01)
G06T 1/20 (2006.01)

(52) U.S. Cl.
CPC ............ G06T 1/60 (2013.01); G06F 12/0813 (2013.01); G06F 12/0875 (2013.01); G06F 13/16 (2013.01); G06T 1/20 (2013.01); G06F 3/0601 (2013.01); G06F 8/443 (2013.01); G06F 2212/1024 (2013.01); G06F 2212/302 (2013.01); G06F 2212/454 (2013.01); G06F 2212/455 (2013.01); H03M 13/6566 (2013.01)

(58) Field of Classification Search
CPC ........ G06F 13/16; G06F 3/0601; G06F 8/443; H03M 13/6566
See application file for complete search history.

(56) References Cited

U.S. PATENT DOCUMENTS 8,364,739 B2    1/2013  Baskaran et al.
2014/0129500 A1*  5/2014  Nice ................. G06N 5/02
                                                 706/46

FOREIGN PATENT DOCUMENTS

WO    2010121228 A2    10/2010
WO    2015004421 A1    1/2015

OTHER PUBLICATIONS

Manshadi, Scalable Optimization Algorithms for Recommender Systems, Jul. 15, 2014, Faculties of Natural Sciences and Technology I of Saarland University, i-121.*

(Continued)

Primary Examiner — Matthew Salvucci
(74) Attorney, Agent, or Firm — Cantor Colburn LLP; Alexa Ashworth

(57) ABSTRACT

Embodiments include method, systems and computer program products for performing memory-aware matrix factorization on a graphics processing unit. Aspects include determining one or more types of memory on the graphics processing unit and determining one or more characteristics of each of the one or more types of memory. Aspects also include assigning each of a plurality of memory accesses of a matrix factorization algorithm to one of the one or more types of memory based on the one or more characteristics and executing the matrix factorization algorithm on the graphics processing unit.

8 Claims, 5 Drawing Sheets

(56) References Cited

OTHER PUBLICATIONS

Kampffmeyer, Parallelization of the Alternating-Least-Squares Algorithm With Weighted Regularization for Efficient GPU Execution in Recommender Systems, INF-3981—Master's Thesis in Computer Science, Jun. 2015, pp. 1-92.*
Ashari et al., "On optimizing machine learning workloads via kernal infusion" PPoPP 15; Feb. 7-11, 2015; Copyright 2015 ACM, pp. 173-182.
Chen et al., "Nonzero Pattern Analysis and Memory Access Optimization in GPU-based Sparse LU Factorization for Circuit Simulation", Proceedings of the 3rd Workshop on Irregular Applications: Architectures and Algorithms, 2013 ACM; 8 pgs.
Li et al., "Sparkler: Supporting Large-Scale Matrix Factorization", EDBT/ICDT '13, Mar. 18-22 2013, Genoa, Italy, Copyright 2013 ACM, 12 pgs.
Vishwas et al., "Implementing a parallel matrix factorization library on the cell broadband engine", Scientific Programming 17, issue 1-2, (2009) pp. 3-29.
Yun et al., "NOMAD: Non-locking, stOchastic Multi-machine algorithm for Asynchronous and Decentralized matrix completion", Proceedings of the VLDB Endowment, vol. 7, No. 11, Copyright 2014 VLDB Endowment, 12 pgs.
Zhuang et al., "A Fast Parallel Sgd for Matrix Factorization in Shared Memory Systems", RecSys'13, Oct. 12-16, 2013, Hong Kong, China; Copyright 2013 ACM; 8 pgs.
Liana L. Fong, et al., Pending U.S. Appl. No. 14/920,111 entitled "Parallelizing Matrix Factorization Across Hardware Accelerators," filed with the U.S. Patent and Trademark office on Oct. 22, 2015.
Liana L. Fong, et al., Pending U.S. Appl. No. 14/953,645 entitled "Parallelizing Matrix Factorization Across Hardware Accelerators," filed with the U.S. Patent and Trademark office on Nov. 30, 2015.
Liangliang Cao, et al., Pending U.S. Appl. No. 14/967,417 entitled "Memory-Aware Matrix Factorizaion", filed with the U.S Patent and Trademark office on Dec. 14, 2015.
List of IBM Patents or Patent Applications Treated As Related; (Appendix P), Filed Feb. 29, 2016; 2 pages.

* cited by examiner

Algorithm 1 Base ALS: Update $X$

1: for $u \leftarrow 1, m$ do
2:    $\Theta_u^T \leftarrow$ sub-matrix of $\Theta^T$ where cols $\theta_v$ s.t. $r_{uv} \neq 0$
3:    $A_u \leftarrow 0$
4:    for all columns $\theta_v$ in $\Theta_u^T$ do
5:      $A_u \leftarrow A_u + \theta_v \theta_v^T + \lambda I$
6:    end for
7:    $B_u \leftarrow \Theta^T \cdot [R(u,:)]^T$
8:    $x_u \leftarrow$ solve $A_u \cdot x_u = B_u$
9: end for

FIG. 3A
Prior Art

Algorithm 2 cuMF: Update $X$.
$\mathcal{G}\{var\}$: $var$ in global memory
$\mathcal{T}\{var\}$: $var$ in texture memory
$\mathcal{S}\{var\}$: $var$ in shared memory
$\mathcal{R}\{var\}$: $var$ in register memory 1: for $u \leftarrow 1, m$ do
2:    $\mathcal{T}\{\Theta_u^T\} \leftarrow$ sub-matrix of $\mathcal{G}\{\Theta^T\}$ where cols $\theta_v$ s.t. $r_{u,v} \neq 0$
3:    $\mathcal{R}\{A_u\} \leftarrow 0$
4:    while $\mathcal{T}\{\Theta_u^T\}$ has more cols not processed do
5:      $\mathcal{S}\{\Theta_u^T[bin]\} \leftarrow$ next $bin$ cols from $\mathcal{T}\{\Theta_u^T\}$
6:      for all cols $\theta_v$ in $\mathcal{S}\{\Theta_u^T[bin]\}$ do
7:         $\mathcal{R}\{A_u\} \leftarrow \mathcal{R}\{A_u\} + \mathcal{S}\{\theta_v \theta_v^T\} + \lambda I$
8:      end for
9:    end while
10:   $\mathcal{G}\{A_u\} \leftarrow \mathcal{R}\{A_u\}$
11:   $\mathcal{G}\{B_u\} \leftarrow \mathcal{G}\{\Theta^T\} \cdot \mathcal{G}\{[R(u,:)]^T\}$
12:   $\mathcal{G}\{x_u\} \leftarrow$ solve $\mathcal{G}\{A_u\} \cdot \mathcal{G}\{x_u\} = \mathcal{G}\{B_u\}$
13: end for

MEMORY-AWARE MATRIX FACTORIZATION

BACKGROUND

The present disclosure relates to matrix factorization and more specifically, to methods, systems and computer program products for performing memory-aware matrix factorization.

Recommendation systems are becoming more and more pervasive in Internet applications such as music sharing, e-commerce, and on-demand Internet streaming media. Moreover, recommendation systems can be combined with other applications, like ranking and filtering, to develop new products in online advertisement and user-centric information retrieval. A common technique used in recommendation systems is the factorization of a user-item matrix R, whose entries at (u; v) denote a preference of user u on item v. This user-item matrix R is generally a sparse matrix and matrix factorization is used to generate estimated entries for the entries that have null, or zero values. A matrix-factorization based collaborative filter is generally considered one of the best models for recommendation systems.

The problem of matrix factorization is to decompose matrix R into two dense matrixes X and $\Theta$, such that: $R \approx X \cdot \Theta^T$. Assuming that $r_{u,v}$ is an non-zero element of matrix R at position (u; v), the matrix factorization can be accomplished by the minimization of the following cost function:

$$J = \sum_{u,v} (r_{u,v} - X_u^T \theta_v)^2 + \lambda \left( \sum_u n_{x_u} \|X_u\|^2 + \sum_v n_{\theta_v} \|\theta_v\|^2 \right) \quad (1)$$

where $x^T_u$ and $\Theta_v$ are the uth row of X and the with column of $\Theta^T$, respectively.

The optimization of the above cost function (1) can be done through many classical optimization methods, including alternative least square, coordinate descent and stochastic gradient descent have been applied to solve this problem. The nature of matrix factorization is computation expensive and accordingly, for real-life, industry-scale matrix factorization problems, parallel computing is often used. Parallelizing the optimization problem of matrix factorization is difficult because many classical algorithms for matrix factorization are sequential instead of parallel. There have been a lot of efforts in applying parallel computing methods for matrix factorization, especially in the scenario of shared memory, CPU-based systems. However, such methods suffer from locking, discontinuous memory access and memory hotspots.

SUMMARY

In accordance with an embodiment, a method for performing memory-aware matrix factorization is provided. Aspects include determining one or more types of memory on the graphics processing unit and determining one or more characteristics of each of the one or more types of memory. Aspects also include assigning each of a plurality of memory accesses of a matrix factorization algorithm to one of the one or more types of memory based on the one or more characteristics and executing the matrix factorization algorithm on the graphics processing unit.

In accordance with another embodiment, a graphics processing unit for performing memory-aware matrix factorization includes a processor configured to perform a method. Aspects include determining one or more types of memory on the graphics processing unit and determining one or more characteristics of each of the one or more types of memory. Aspects also include assigning each of a plurality of memory accesses of a matrix factorization algorithm to one of the one or more types of memory based on the one or more characteristics and executing the matrix factorization algorithm on the graphics processing unit.

In accordance with a further embodiment, a computer program product for performing memory-aware matrix factorization includes a non-transitory storage medium readable by a processing circuit and storing instructions for execution by the processing circuit for performing a method. Aspects include determining one or more types of memory on the graphics processing unit and determining one or more characteristics of each of the one or more types of memory. Aspects also include assigning each of a plurality of memory accesses of a matrix factorization algorithm to one of the one or more types of memory based on the one or more characteristics and executing the matrix factorization algorithm on the graphics processing unit.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 3A is an alternating least square (ALS) algorithm for performing matrix factorization;

FIG. 3B is an alternating least square (ALS) algorithm for performing memory-aware matrix factorization in accordance with an exemplary embodiment;

DETAILED DESCRIPTION

In accordance with exemplary embodiments of the disclosure, methods, systems and computer program products for performing memory-aware matrix factorization are provided. In exemplary embodiments, a method for executing a matrix factorization algorithm on a graphics processing unit includes determining available types of memory on the graphics processing unit and one or more characteristics for each type of available memory. The method also includes assigning the storage of each variable used by the matrix factorization algorithm to one of the available types of memory based on the characteristics for each type of available memory. In exemplary embodiments, the performance of the graphics processing unit in executing the matrix factorization algorithm is improved by assigning the storage of each variable used by the matrix factorization algorithm to one of the available types of memory based on the characteristics for each type of available memory. In exemplary embodiments, the matrix factorization algorithm is an alternating least square (ALS) algorithm.

In exemplary embodiments, by storing each of the variables used by a matrix factorization algorithm to a type of memory based on the characteristics of the memory, the memory accesses of the matrix factorization algorithm can be optimized. The optimization can include reducing discontiguous memory access and/or caching hotspot, or frequently accessed variables. For example, the optimization of the memory access can include transforming discontiguous memory accesses to contiguous memory accesses, and allocating faster memory to hotspot variables. As a result, the performance of the graphics processing unit, and by extension the computer system having the graphics processing unit, in executing the matrix factorization algorithm is improved.

Figure 1:
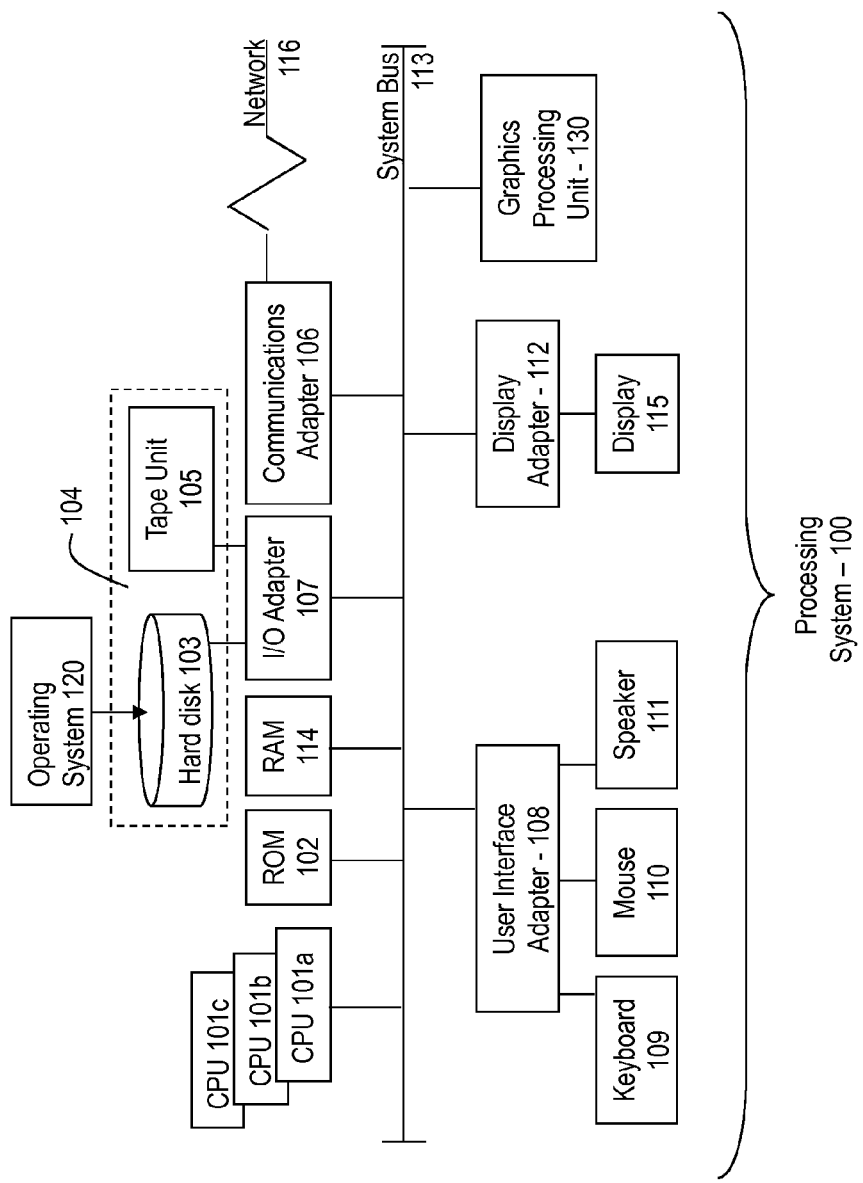
FIG. 1 is a block diagram illustrating one example of a processing system for practice of the teachings herein.

Referring to FIG. 1, there is shown an embodiment of a processing system 100 for implementing the teachings herein. In this embodiment, the system 100 has one or more central processing units (processors) 101a, 101b, 101c, etc. (collectively or generically referred to as processor(s) 101). In one embodiment, each processor 101 may include a reduced instruction set computer (RISC) microprocessor. Processors 101 are coupled to system memory 114 and various other components via a system bus 113. Read only memory (ROM) 102 is coupled to the system bus 113 and may include a basic input/output system (BIOS), which controls certain basic functions of system 100.

FIG. 1 further depicts an input/output (I/O) adapter 107 and a network adapter 106 coupled to the system bus 113. I/O adapter 107 may be a small computer system interface (SCSI) adapter that communicates with a hard disk 103 and/or tape storage drive 105 or any other similar component. I/O adapter 107, hard disk 103, and tape storage device 105 are collectively referred to herein as mass storage 104. Operating system 120 for execution on the processing system 100 may be stored in mass storage 104. A network adapter 106 interconnects bus 113 with an outside network 116 enabling data processing system 100 to communicate with other such systems. A screen (e.g., a display monitor) 115 is connected to system bus 113 by display adaptor 112, which may include a graphics adapter to improve the performance of graphics intensive applications and a video controller. In one embodiment, adapters 107, 106, and 112 may be connected to one or more I/O busses that are connected to system bus 113 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 113 via user interface adapter 108 and display adapter 112. A keyboard 109, mouse 110, and speaker 111 all interconnected to bus 113 via user interface adapter 108, which may include, for example, a Super I/O chip integrating multiple device adapters into a single integrated circuit.

In exemplary embodiments, the processing system 100 includes a graphics processing unit 130. Graphics processing unit 130 is a specialized electronic circuit designed to manipulate and alter memory to accelerate the creation of images in a frame buffer intended for output to a display. In general, graphics processing unit 130 is very efficient at manipulating computer graphics and image processing, and has a highly parallel structure that makes it more effective than general-purpose CPUs for algorithms where processing of large blocks of data is done in parallel.

Thus, as configured in FIG. 1, the system 100 includes processing capability in the form of processors 101, storage capability including system memory 114 and mass storage 104, input means such as keyboard 109 and mouse 110, and output capability including speaker 111 and display 115. In one embodiment, a portion of system memory 114 and mass storage 104 collectively store an operating system such as the AIX® operating system from IBM Corporation to coordinate the functions of the various components shown in FIG. 1.

Figure 2:
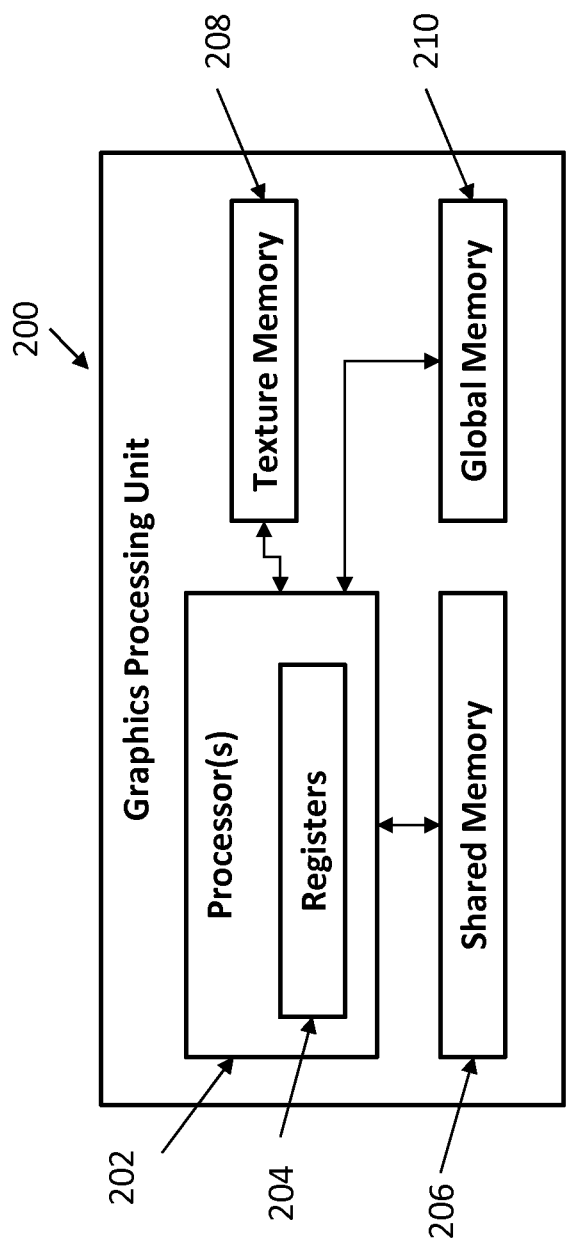
FIG. 2 is a block diagrams illustrating a graphics processing unit in accordance with exemplary embodiments.

Referring now to FIG. 2, a graphics processing unit 200 is illustrated. The graphics processing unit 200 includes one or more processors 202 that each include a plurality of registers 204. The graphics processing unit 200 also includes a shared memory 206, which may also be embodied in a cache memory. In exemplary embodiments, the access latency for the shared memory 206 is greater than the access latency for the registers 204, but is less than other memory types available to the processors 202. The graphics processing unit 200 also includes a texture memory 208, which is a read-only memory which may be embodied in a cache memory. In exemplary embodiments, the access latency for the texture memory 208 is greater than the access latency for the registers 204 and the shared memory 206, but is less than other memory types. The graphics processing unit 200 also includes a global memory 210, which may be embodied in a DRAM or other suitable type of memory. In exemplary embodiments, the access latency for the global memory 208 is greater than the access latency for the registers 204, the shared memory 206 and the texture memory 208. In exemplary embodiments, the texture memory 208 can be used to store cached entries from a global memory 210. In exemplary embodiments, the global memory 210 is relatively slow, the texture memory 208 is read only, and the register 204 and shared memory 206 are not visible across kernels (i.e., GPU device functions).

In general, the implementation of matrix factorization algorithm on a graphics processing unit 200 is more complex than implementing the matrix factorization algorithm on a general processor or CPU. One reason is due to the lower clock frequency (e.g., 850 Hz) of a graphics processing unit 200 than CPU (e.g., 2 GHz). Another reason is that the graphics processing unit 200 typically includes less memory (e.g. 4-12 GB) than a CPU (e.g., 32-256 GB). In addition, the control of registers, shared and texture memory is not as easily performed in a graphics processing unit 200 as it is in a CPU. This is because the compilers on GPUs are less powerful in automatically managing a complex memory hierarchy, and as a consequence GPU programmers have to make more explicit control of the memory hierarchy.

One approach to optimize the non-convex cost function in (1) is to iteratively optimize X while fixing Θ, and then optimize Θ while fixing X. Consider:

$$\frac{\partial J}{\partial x_u} = 0$$

$$\frac{\partial J}{\partial \theta_v} = 0$$

Which leads to the following equation:

$$X_u \cdot \sum_{r_{uv} \neq 0} (\theta_v \theta_v^T + \lambda I) = \Theta^T \cdot [R(u,:)]^T \qquad (2)$$

together with:

$$\theta_v \cdot \sum_{r_{uv} \neq 0} (X_u X_u^T + \lambda I) = X^T \cdot R(:,v) \qquad (3)$$

which is known as the alternating least squares (ALS) method. As used herein, λ is a user-provided real number for regularization purpose; I is an identity matrix of dimension f (f is the number of columns of X).

The computational cost of executing the ALS method can be analyzed by the following solution as a representation to update $x_u$ and $\Theta_v$:

$$X_u = \left[\sum_{r_{uv} \neq 0}(\theta_v \theta_v^T + \lambda I)\right]^{-1} = \Theta^T[R(u,:)]^T, \text{ for } u = 1, 2, \ldots m \quad (4)$$

$$\theta_v \cdot \left[\sum_{r_{uv} \neq 0}(X_u X_u^T + \lambda I)\right]^{-1} = X^T R(:,v), \text{ for } v = 1, 2, \ldots n$$

where m is the number of users and n is the number of items.

As can be seen in Eq. (4), X and Θ are updated alternatively and iteratively, while the update of each $x_u$ and $\Theta_v$ are independent of each other, respectively. Eq. (4)'s memory access comes in several aspects including: accessing a row R(u; :) or a column R(: ; v) from the user-item matrix R; accessing collection of columns $\Theta_v$ subject to $r_{u;v} \neq 0$ for every u; and accessing collection of rows $x_u^T$ subject to $r_{u;v} \neq 0$ for every v; aggregating many $\Theta_v \cdot \Theta_v^T$ for every u; and aggregating many $x_u \cdot x_u^T$ for every v.

In each iteration of Eq. (4) to solve for X and Θ, a certain row or column of R needs to be accessed only once. In contrast, in each iteration, to solve for a single $x_u$, a $\Sigma_v$ 1 $r_{u;v \neq 0}$ number of columns spread discontiguously across the many columns in $\Theta^T$ need to be accessed. For example, in a sample data set, assume on average one user rates 200+ items; this leads to a discontiguous access of 200+$\Theta_v$ columns among the total 17,770 columns in $\Theta^T$. Similarly, to solve for a single $\Theta_v$, a $\Sigma_u$ 1 $r_{u;v \neq 0}$ number of rows of X need to be accessed.

In addition, according to Eq. (4), solving for one $x_u$ requires computing and aggregating $\Theta_v \cdot \Theta_v^T$. Therefore, each element in column vector $\Theta_v$ is accessed frequently, and the aggregation updated frequently. Suppose the dimensionality of $\Theta_v$ is f, then to compute $\Theta_v \cdot \Theta_v^T$, each element of $\Theta_v$ will be read f times and to add $\Theta_v \cdot \Theta_v^T$ to $\Sigma r_{u;v \neq 0} (\Theta_v \cdot \Theta_v^T + \lambda I)$ will require $f^2$ writes. Table 1 compares the cost from these three types of memory accesses.

TABLE I

THE MEMORY ACCESS COST FROM DIFFERENT COMPUTATIONS, IN EACH ALS ITERATION.

| Target | Number of access per row/column, and per iteration |
|---|---|
| R(u, :) | 1 |
| R(:, v) | 1 |
| all $\theta_v \theta_v^T$ for a $x_u$ | $\Sigma_v 1_{r_{u,v} \neq 0} \cdot f$ |
| all $x_u x_u^T$ for a $\theta_v$ | $\Sigma_u 1_{r_{u,v} \neq 0} \cdot f$ |
| $\sum_{r_{uv} \neq 0} \theta_v \theta_v^T$ for a $x_u$ | $\Sigma_v 1_{r_{u,v} \neq 0} \cdot f^2$ |
| $\sum_{r_{uv} \neq 0} x_u x_u^T$ for a $\theta_u$ | $\Sigma_u 1_{r_{u,v} \neq 0} \cdot f^2$ |

In exemplary embodiments, a method for performing memory aware matrix factorization reduces the cost of memory access. In exemplary embodiments, the number of memory access may not be reduced from traditional matrix factorization. However, the method for performing memory aware matrix factorization transforms discontiguous memory accesses to contiguous memory accesses and allocates faster memory to hotspot variables to reduce the cost of the memory access.

In exemplary embodiments, a given column vector $\Theta_v$ is needed to update many $x_u$s as long as $r_{u;v \neq 0}$. Therefore one $\Theta_v$ will be read $\Sigma_u$ 1 $r_{u;v \neq 0}$ many times and is worth storing in a cache memory. Also, updating a given column vector $x_u$ requires many $\Theta_v$s as long as $r_{u;v} \neq 0$. Accordingly, in exemplary embodiments, discontiguous memory accesses can be reduced by caching all needed $\Theta_v$s in the memory space of $x_u$ update, so that later computation on $\Theta_v$s does not need to access the discontiguous memory again. In exemplary embodiments, memory accesses can further be optimized by caching hotspot variables. In one embodiment, the aggregation variable $\Sigma r_{u;v \neq 0} (\Theta_v \cdot \Theta_v^T + \lambda I)$ is stored in register because it needs to be updated frequently, i.e., each time a $\Theta_v \cdot \Theta_v^T$ is added in.

The challenge of implementing such changes to the memory accesses is that, in any computer architecture with a memory hierarchy, faster memory such as cache is a limited resource. Therefore, both the memory access patterns of the matrix factorization algorithm and the memory hierarchy, capacity and characteristics of a given computer hardware need to be considered. For example, all needed $\Theta_v$s, and $\Sigma r_{u;v \neq 0} (\Theta_v \cdot \Theta_v^T + \lambda I)$ for a single $x_u$ may be too big to store in the cache memory of a graphics processing unit and therefore the computation and caching may need to be performed in stages. In exemplary embodiments, the memory aware method performing matrix factorization includes selecting $\Theta_v$ according to the constraint $r_{u;v} \neq 0$, which is different from the traditional dense matrix multiplication, and since there are many $\Theta_v \cdot \Theta_v^T$ of executed in parallel, careful allocation of the multiple processors to utilize the limited cache is needed for efficient computing. FIG. 3B is an alternating least square (ALS) algorithm for performing memory-aware matrix factorization in accordance with an exemplary embodiment.

When running Algorithm 1, shown in FIG. 3A, it was observed that about 80% of the total execution time lies in computing $A_u$, while generating $B_u$ and solving the equations take about 20% of the total execution time. Accordingly, in order to efficiently compute $A_u$, the memory accesses need to be optimized, as discussed in further detail below.

As shown in line 2, Algorithm 1 includes reading from $\Theta^T \cdot \Theta^T$ whose dimension is f×n, is stored in global memory. Accordingly, when collecting submatrix $\Theta_u^T$ from $\Theta^T$, texture memory is used as cache because the collecting process enjoys spatial locality and because $\Theta^T$ is read-only, as is shown in line 2 of Algorithm 2. In addition, different $\Theta_u^T$ can potentially re-use the same $\Theta_v$s cached in texture memory. In exemplary embodiments, this caching step also reduces discontiguous memory access.

As shown in line 2, caching the read-only $\Theta^T$ in texture memory reduces the need for concurrency control since the data $\Theta^T$ will not be changed by any thread that accesses it. With this hint, the graphics processing unit can speed up the memory access.

As shown in line 2, Algorithm 1 includes storing $\Theta_u^T$. In exemplary embodiments, one thread block consisting off threads is used to solve each $x_u$, and the per-block shared memory is used to store $\Theta_u^T$, so as to speed up the subsequent read in line 5. However, for each block, the whole $\Theta_u^T$ is not copied into its shared memory space because $\Theta_u^T$ is of size f×$n_{x_u}$ (recall that $n_{x_u}$ is the number of items user u has rated) and is too large compared to the shared memory. If a single thread block consumes a large portion of the limited shared memory, other blocks that cannot obtain the shared memory are prohibited from launching, resulting in low parallelism in the graphics processing unit. To achieve a higher parallelism and utilization, for each $x_u$, instead of allocating an $f \times n_{x_u}$ block, a bin size bin is selected and a block $\Theta_u^T$ [bin] of size $f \times$ bin is allocated. In exemplary embodiments, a bin between 10 and 20 can be used, while $n_{x_u}$ can be hundreds or thousands. A subset of $\Theta_u^T$ is iteratively moved into $\Theta_u^T$ [bin] to be processed in the following step.

As shown in line 5, Algorithm 1 includes writing $A_u$ by reading a $\Theta_v$ from $\Theta_u^T$ [bin], calculating the $f \times f$ elements of $\Theta_v \Theta_v^T$, and adding them to global memory $A_u$. Since $A_u$ is a memory hotspot, it is stored in the register memory to partially aggregate $$\sum_{\theta_{v\_} \in \Theta_u^T [bin]} \theta_v \theta_v^T$$

and only need to update global memory $A_u$ after iterating over all columns in $\Theta_u^T$ [bin]. In exemplary embodiments, storing $A_u$ in the register memory reduces global memory access by a factor of $n_{x_u}$.

FIG. 3B illustrates an alternating least square (ALS) algorithm for performing memory-aware matrix factorization in accordance with an exemplary embodiments. As illustrated, each of the memory accesses of the algorithm have been assigned to one of the various types of memory available on the graphics processing unit based on the characteristics of the memory type and upon the type of memory access.

Figure 4:
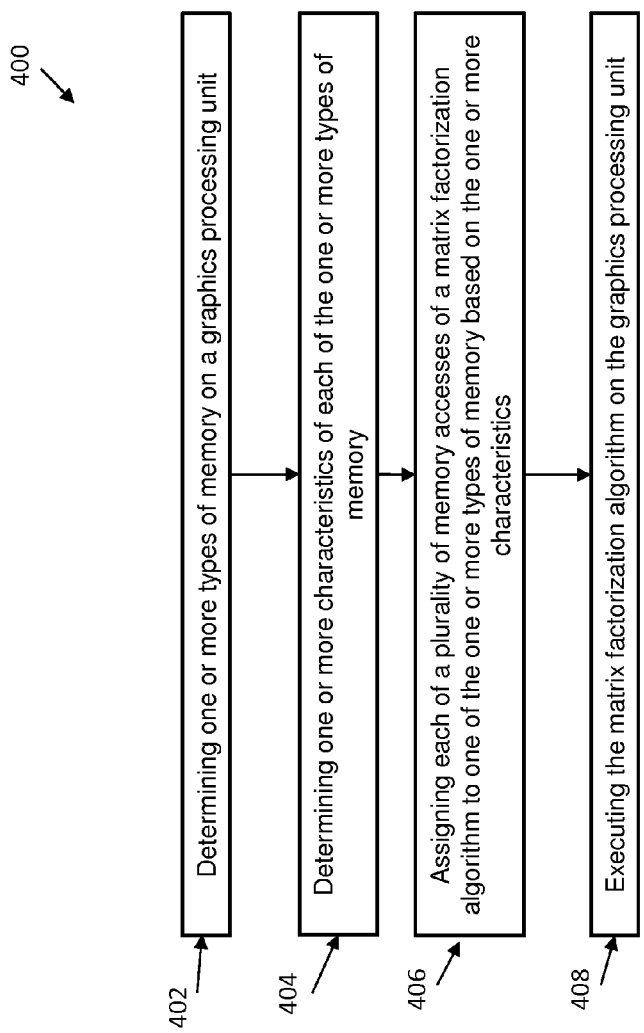
FIG. 4 is a flow diagram of a method for performing memory-aware matrix factorization in accordance with an exemplary embodiment.

Referring now to FIG. 4, a flow diagram of a method 400 for performing memory-aware matrix factorization on a graphics processing unit in accordance with an exemplary embodiment is shown. As shown at block 402, the method 400 includes determining one or more types of memory on the graphics processing unit. In exemplary embodiments, the one or more types of memory may include registers, cache and global memory, such as DRAM. Next, as shown at block 404, the method 400 includes determining one or more characteristics of each of the one or more types of memory. In exemplary embodiments, the characteristics may include, but are not limited to, size, access latency, read/write permissions, and the like. In exemplary embodiments, the cache may be divided into shared memory and texture memory, wherein the texture memory is a cache memory that is read-only. In exemplary embodiments, the texture memory is used to store cached entries from a global memory. In exemplary embodiments, the shared memory may not be visible across kernels (i.e., GPU device functions). Next, as shown at block 406, the method 400 includes assigning each of a plurality of memory accesses of a matrix factorization algorithm to one of the one or more types of memory based on the one or more characteristics. In exemplary embodiments, the assignment of memory accesses to the memory types is configured to reduce discontiguous memory access and/or to cache hotspot, or frequently accessed, variables. In exemplary embodiments, the each of the memory accesses have one or more attributes that include, but are not limited to, a frequency that a stored variable is accessed and a contiguousness that accessed data is stored in the memory. The assignment of the memory accesses to the memory types is configured to align the attributes of the memory accesses with the characteristics of the memory types. The method 400 also includes executing the matrix factorization algorithm on the graphics processing unit, as shown at block 408.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer program product for performing memory-aware matrix factorization on a graphics processing unit, the computer program product comprising:
    a non-transitory storage medium readable by a processing circuit and storing instructions for execution by the processing circuit for performing a method comprising:
    determining one or more types of memory on the graphics processing unit;
    determining one or more characteristics of each of the one or more types of memory;
    assigning each of a plurality of memory accesses of a matrix factorization algorithm to one of the one or more types of memory based on the one or more characteristics; and
    executing the matrix factorization algorithm on the graphics processing unit,
    wherein the one or more types of memory include a register memory, a cache memory and a global memory and wherein the cache memory includes a shared memory and a texture memory, wherein the texture memory is read-only.

2. The computer program product of claim 1, wherein the assignment of the plurality of memory accesses is configured to store hotspot variables in the cache memory.

3. The computer program product of claim 1, wherein the characteristics include at least one of a memory size, an access latency, and a read/write permission.

4. The computer program product of claim 1, wherein the texture memory is used to store cached entries from the global memory.

5. The computer program product of claim 1, wherein the texture memory is used to cache read-only entries from the global memory.

6. A graphics processing unit for performing memory-aware matrix factorization, comprising:
    a processor in communication with one or more types of memory, the processor configured to:
    determine the one or more types of memory on the graphics processing unit;
    determine one or more characteristics of each of the one or more types of memory;
    assign each of a plurality of memory accesses of a matrix factorization algorithm to one of the one or more types of memory based on the one or more characteristics; and
    execute the matrix factorization algorithm on the graphics processing unit,
    wherein the one or more types of memory include a register memory, a cache memory and a global memory and wherein the cache memory includes a shared memory and a texture memory, wherein the texture memory is read-only.

7. The graphics processing unit of claim 6, wherein the one or more types of memory include a register memory, a cache memory and a global memory.

8. The graphics processing unit of claim 6, wherein the assignment of the plurality of memory accesses is configured to store hotspot variables in the cache memory.

* * * * *